(12) United States Patent
Male et al.

(10) Patent No.: US 6,317,069 B1
(45) Date of Patent: Nov. 13, 2001

(54) DIGITAL-TO-ANALOG CONVERTER EMPLOYING BINARY-WEIGHTED TRANSISTOR ARRAY

(75) Inventors: Barry Male, West Granby, CT (US); William Martin, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/444,920

(22) Filed: Nov. 24, 1999

Related U.S. Application Data
(60) Provisional application No. 60/132,856, filed on May 6, 1999.

(51) Int. Cl.[7] .............................. H03M 1/78; H03M 1/66
(52) U.S. Cl. ........................................... 341/154; 341/145
(58) Field of Search .................................... 341/145, 154, 341/144, 153

(56) References Cited

U.S. PATENT DOCUMENTS

| | | | |
|---|---|---|---|
| 4,352,092 | 9/1982 | Masuda et al. | 340/347 |
| 4,635,038 | 1/1987 | Wincn | 340/347 |
| 4,667,178 | 5/1987 | Ryu | 340/347 DA |
| 4,800,365 | 1/1989 | White et al. | 341/119 |
| 4,918,448 | 4/1990 | Hauviller et al. | 341/145 |
| 5,065,159 | 11/1991 | Kuwana | 341/148 |
| 5,075,677 | 12/1991 | Meaney et al. | 341/136 |
| 5,093,661 | 3/1992 | Tanimoto | 341/144 |
| 5,327,131 | 7/1994 | Ueno et al. | 341/136 |
| 5,554,986 | 9/1996 | Neidorff | 341/145 |
| 5,606,275 | 2/1997 | Farhang et al. | 327/108 |
| 5,648,780 | 7/1997 | Neidorff | 341/154 |
| 5,764,174 | 6/1998 | Dempsey et al. | 341/154 |
| 5,801,655 | * 9/1998 | Imamura | 341/145 |
| 5,815,103 | * 9/1998 | Comminges et al. | 341/144 |
| 6,157,334 | * 12/2000 | Kimura | 341/153 |

* cited by examiner

*Primary Examiner*—Peguy JeanPierre
(74) *Attorney, Agent, or Firm*—W. Daniel Swayze, Jr.; W. James Brady; Frederick J. Telecky, Jr.

(57) ABSTRACT

A digital-to-analog converter having a compact "M-2M" binary-weighted ladder structure, where "M" represents an effective resistance inversely proportional to the W/L line ratio of an n-type or p-type metal oxide semiconductor (MOS) device. A reduction in the number of ladder components is accomplished by utilizing the MOS device's inherent switching function in combination with the device's resistive behavior. The ladder is comprised of a plurality of "2M" rungs, one rung for each binary bit, and each rung is comprised of a complementary pair of upper and lower MOS devices series-connected at a common node. Each device in the pair has an effective resistance of 2M ohms and only one is enabled at any given time depending upon the value of the associated binary bit. Permanently enabled MOS devices having an effective resistance of M ohms and interconnecting the common nodes of adjacent binary bit device pairs make up an "M" runner. The rungs are connected in parallel across upper-level and lower-level voltage references and an analog voltage corresponding to a digital word is generated at the common node of the most significant bit device pair.

12 Claims, 4 Drawing Sheets

DIGITAL-TO-ANALOG CONVERTER EMPLOYING BINARY-WEIGHTED TRANSISTOR ARRAY

CROSS REFERENCE TO RELATED APPLICATIONS

This application claims priority under 35 U.S.C. §119(e) to U.S. Provisional Application Ser. No. 60/132,856, filed May 6, 1999; the disclosure of which is hereby incorporated by reference.

STATEMENT REGARDING FEDERALLY SPONSORED RESEARCH OR DEVELOPMENT

N/A

FIELD OF THE INVENTION

This invention relates generally to digital-to-analog converters and, more particularly, to digital-to-analog converters incorporating binary-weighted resistor arrays or ladders.

BACKGROUND OF THE INVENTION

A variety of circuits for the conversion of a digital word into an analog voltage are known. A digital-to-analog converter (DAC) typically employs a constant impedance resistor string or a binary-weighted resistor array to accomplish the conversion. A constant impedance resistor string is comprised of $2^N$ series-connected resistors, where N equals the number of bit of the digital word to be converted. A voltage reference is placed across the string to thereby generate a series of monotonically increasing voltages. The value of the digital word determines which one of these voltages is selected as the analog output.

Binary-weighted resistor arrays require fewer resistors for a specified number of bits (2N versus $2^N$) and one common array is the "R-2R" ladder 10 illustrated in FIG. 1. The R-2R ladder is comprised of a "runner" of series-connected resistors 2, each having a resistance of R ohms, and a, plurality of "rungs," one for each binary bit of the digital word. A rung includes a resistor 4 of 2R ohms and a switch 6 that is controlled by its associated binary bit signal. A voltage reference, $V_{ref}$, is placed across the R-2R ladder producing binary-weighted currents that are typically summed and converted into an output voltage by an operational amplifier 8.

Unlike the constant impedance resistor string, a binary-weighted resistor array is not an inherently monotonic structure wherein the analog output voltage is guaranteed to monotonically increase as the value of the digital word increases. To avoid the output noise caused by non-monotonic performance, the array resistors must be tightly matched. For example, the resistor matching for the $i_{th}$ bit of an n-bit converter should be within $R/(2^{n-i})$ ohms.

Both the constant impedance resistor string, due to the large number of resistors required, and the binary-weighted array, due to the difficulty in matching the array resistors, are effectively limited in the number of bits that they can convert. To convert digital words having a large number of binary bits, some digital-to-analog converters divide the digital word into a most significant bit (MSB) segment and a least significant bit (LSB) segment and process each segment separately. A segmented DAC structure, described in U.S. Pat. No. 5,648,780, is illustrated in FIG. 2. A first divider stage 20 is responsive to the MSB segment and employs a constant impedance resistor string 22 to generate a series of reference voltages. A decoder 26 generates a plurality of switch control signals 27 to control the switch pairs of a switch string 24 and thereby select, based on the binary value of the MSB segment, an upper-level voltage reference and lower-level voltage reference appearing at a pair of output nodes 28, 29.

A second, last divider stage 30 employs a binary-weighted resistor ladder 32 to produce a voltage at an output node 38. The output voltage depends upon both the established voltage reference range placed across the ladder 32 and the binary value of the LSB segment which controls a plurality of switches 34. If the digital word to be converted is very large, one or more additional divider stages (not shown) may be placed between the first and last divider stages for the bits of the intermediate segments of the digital word.

To achieve the smallest possible package size, a DAC is commonly implemented as a monolithic integrated circuit. Typically, metal oxide semiconductor field effect transistor (MOSFET) devices are used for switches and diffused or implanted structures are used for the resistors. Unfortunately, a monolithic DAC still tends to be relatively large because the switch and resistive devices consume a significant amount of die space. The continued miniaturization of electronic equipment has resulted in a need for an even more compact monolithic DAC.

BRIEF SUMMARY OF THE INVENTION

In accordance with the invention, a monolithic digital-to-analog converter (DAC) is comprised of a binary-weighted array that uses a single n-type or p-type metal oxide semiconductor (MOS) device for each of the resistor/switch combinations that typically make up such arrays. Because a MOS device has a relatively high equivalent resistance per unit area and, furthermore, because the switching function is inherent in a MOS device, a much more compact layout can be achieved by using a single MOS device for each resistor/switch combination.

More particularly, the binary-weighted array has an "M-2M" ladder structure, where "M" refers to the effective resistance of a MOS device when enabled. The M-2M ladder includes one "2M" ladder "rung" for each binary bit, and each rung includes a complementary pair of upper and lower MOS devices series-connected at a common node. Each complementary MOS device has an effective resistance of 2M ohms when enabled and only one device in the pair is enabled at any given time depending upon the value of the associated binary bit. The rungs are connected in parallel and a voltage reference is placed across the pairs.

Permanently enabled MOS devices serve as resistors that interconnect the common nodes of adjacent LSB binary bit device pairs. These interconnecting MOS devices make up the "M" ladder "runner" and each has an effective resistance of M ohms. The voltage generated at the common node of the most significant bit is the analog output, which is isolated from the DAC output terminal by a unity gain buffer amplifier.

To handle digital words having a large number of bits, the DAC may segment the word into a MSB segment and LSB segment and also include an inherently monotonic resistor string. A series of incremental voltages are developed across the string and the binary bits of the MSB segment are used to select an upper-limit voltage reference and lower-limit voltage reference for the "M-2M" array. Because the upper and lower voltage references are limited to a relatively narrow range, the non-linear effects of a MOS device are largely avoided in the "M-2M" array.

BRIEF DESCRIPTION OF THE DRAWING

The invention will be more fully understood by reference to the following Detailed Description of the Invention in conjunction with the drawings, of which.

DETAILED DESCRIPTION OF THE INVENTION

Figure 1:
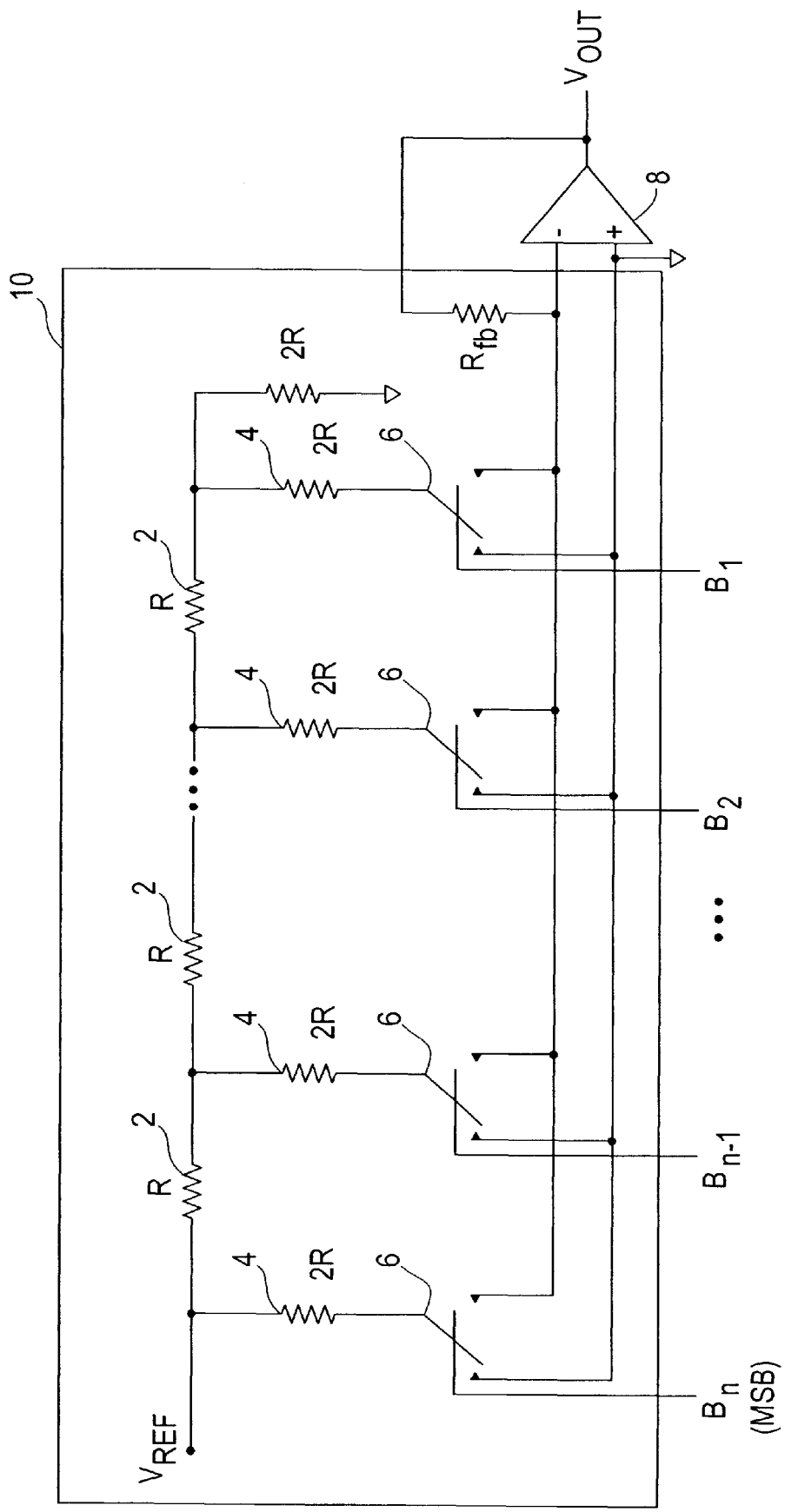
FIG. 1, discussed above, is an illustration of an "R-2R" resistor ladder used in a conventional DAC.
Figure 2:
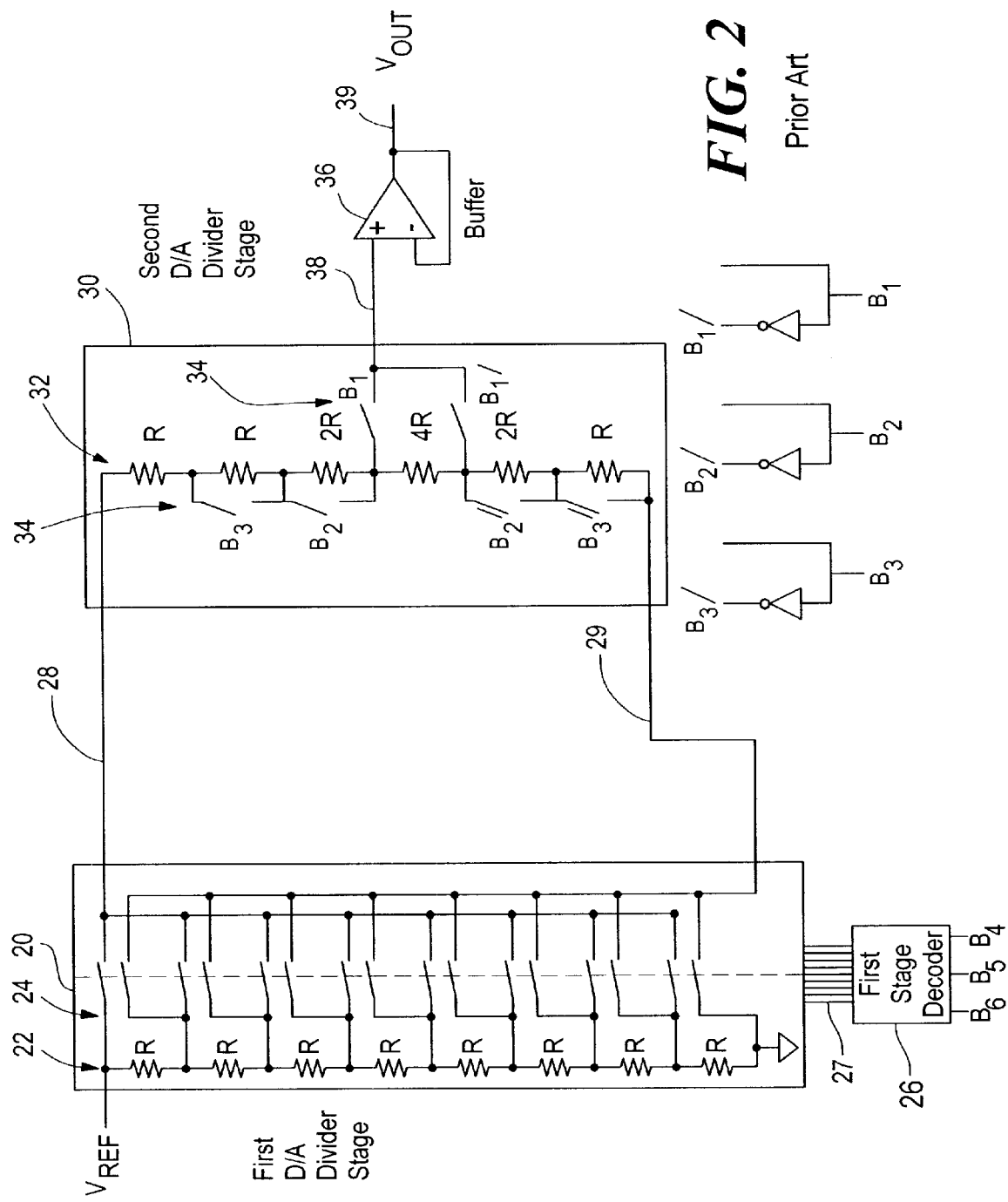
FIG. 2, discussed above, is an illustration of a prior art segmented DAC.
Figure 3:
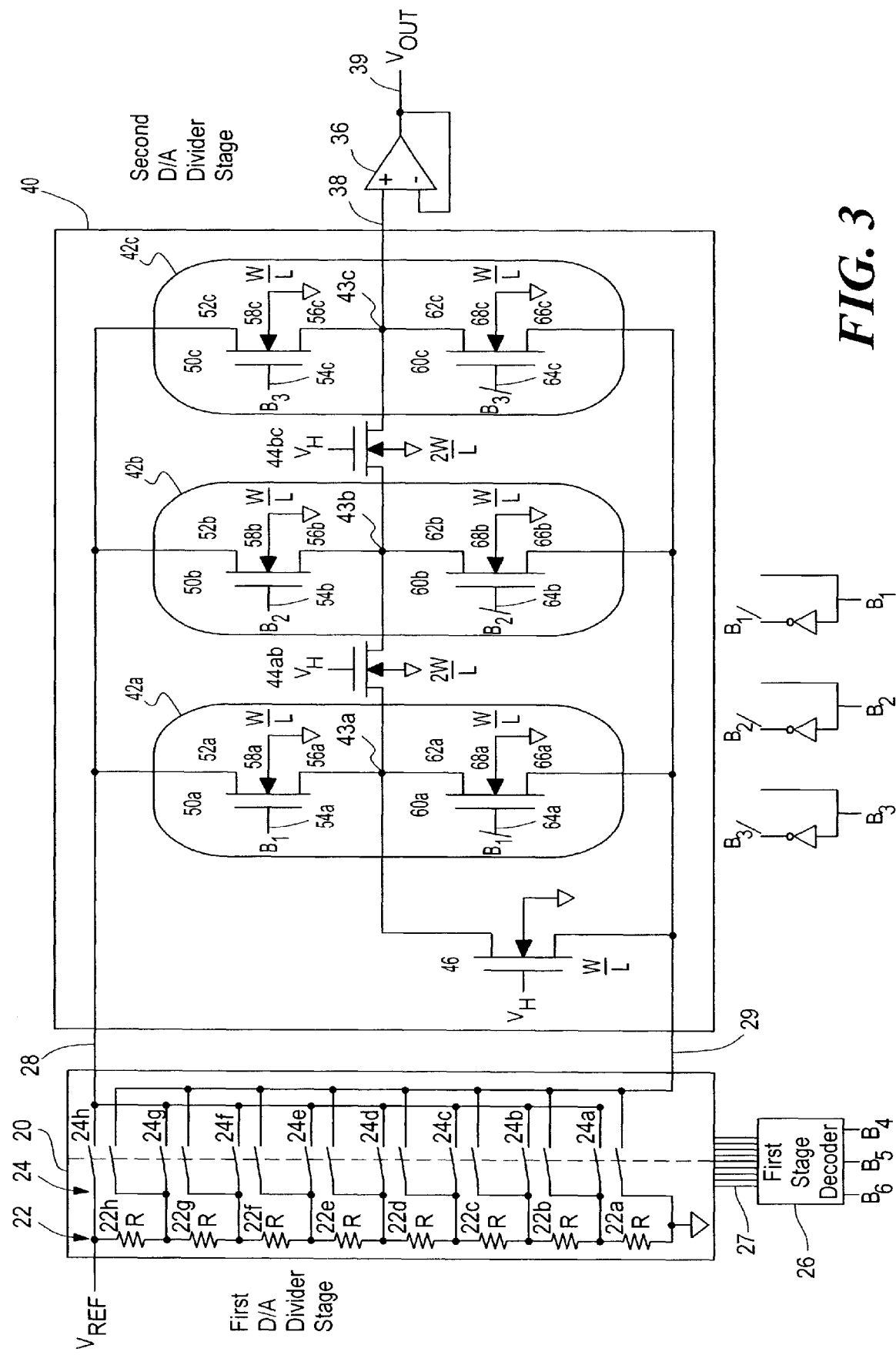
FIG. 3 is an illustration of a segmented DAC incorporating an "N-2N" NMOS device array in accordance with the invention.

A digital-to-analog converter (DAC) in accordance with the invention is illustrated in FIG. 3. The DAC includes a first divider stage 20 for conversion of the MSB segment of a digital word and a second, last divider stage 40 for conversion of the LSB segment.

The first divider stage 20 includes a resistor string 22 made up of a plurality of series-connected resistors coupled across a reference voltage, $V_{ref}$, and ground.

Preferably, the ladder resistors 22a–22h are comprised of polycrystalline silicon and should have a resistance of approximately one-tenth the below-discussed load impedance of the second divider stage 40. The first divider stage 20 also includes a plurality of upper/lower switch pairs 24a–24h arranged to connect the ladder resistors to a pair of output nodes 28, 29.

A first stage decoder 26 is responsive to the binary bits of the MSB segment and generates a plurality of switch control signals 27 for controlling the upper/lower switch pairs 24a–24h which interconnect the resistors of the first stage resistor ladder 22 to the output nodes 28, 29. One method for implementing such a decoder is described in the above-referenced U.S. Pat. No. 5,648,780. The first divider stage 20 generates an upper-limit voltage reference, $V_{refu}$, and a lower-limit voltage reference, $V_{refl}$, at the two output nodes 28, 29, respectively, for use by the last divider stage 40.

The last divider stage 40 includes a plurality of complementary n-type MOS (NMOS) device pairs 42a, 42b, 42c, one for each binary bit of the LSB segment. Each pair 42a–42c is comprised of an upper NMOS device 50a, 50b, 50c and a lower NMOS device 60a, 60b, 60c series-connected at a common node 43a, 43b, 43c via the source pin 56a, 56b, 56c of the upper NMOS device 50a–50c and the drain pin 62a, 62b, 62c of the lower NMOS device 60a–60c. These pairs 42a–42c are connected in parallel with the drain pin 52a, 52b, 52c of each upper NMOS device 50a–50c connected to the upper-level voltage reference, $V_{refu}$, and the source pin 66a, 66b, 66c of each lower NMOS device 60a–60c connected to the lower-level voltage reference, $V_{refl}$. The gate pin 54a, 54b, 54c of each upper NMOS device 50a–50c is connected to its corresponding binary bit signal B1, B2, B3. The gate pin 64a, 64b, 64c of each lower NMOS device 60a–60c is connected to the inverse of its corresponding binary bit signal B1/, B2/, B3/. The substrate base pin of each device 58a–58c, 68a–68c is connected to its corresponding source pin 56a–56c, 66a–66c.

The NMOS device pairs 42 of adjacent binary bits are interconnected at their common nodes by interconnecting NMOS devices 44ab, 44bc. As described below, all interconnecting NMOS devices 44 are permanently enabled (i.e., switched "on") with an effective resistance of N ohms. The last divider stage 40 also includes an additional permanently enabled NMOS device 46 having an effective resistance of 2N ohms and connected between the common node 43a and the lower-level voltage reference, $V_{refl}$, to implement a ½ LSB shift. The common node 43c of the highest bit, B3, of the LSB segment serves as the output node 38 for the second divider stage 40. A unity-gain buffer amplifier 36 isolates the output node 38 from the DAC output terminal 39.

When a bit signal B1, B2, B3 is false, the upper NMOS device 50a–50c is switched "off" and an essentially open circuit exists between the drain 52a–52c and the common node 43a–43c. At the same time, the lower NMOS device 60a–60c is switched "on" and its effective resistance determines the amount of current flowing through the device. The characteristics of an NMOS device, including its effective resistance, are described below. Alternatively, when a bit signal B1–B3 is true, the lower NMOS device 60a–60c is switched "off" to become an open circuit, and the upper NMOS device 50a–50c is switched "on" to establish a current flow through the device as determined by its effective resistance.

Figure 4:
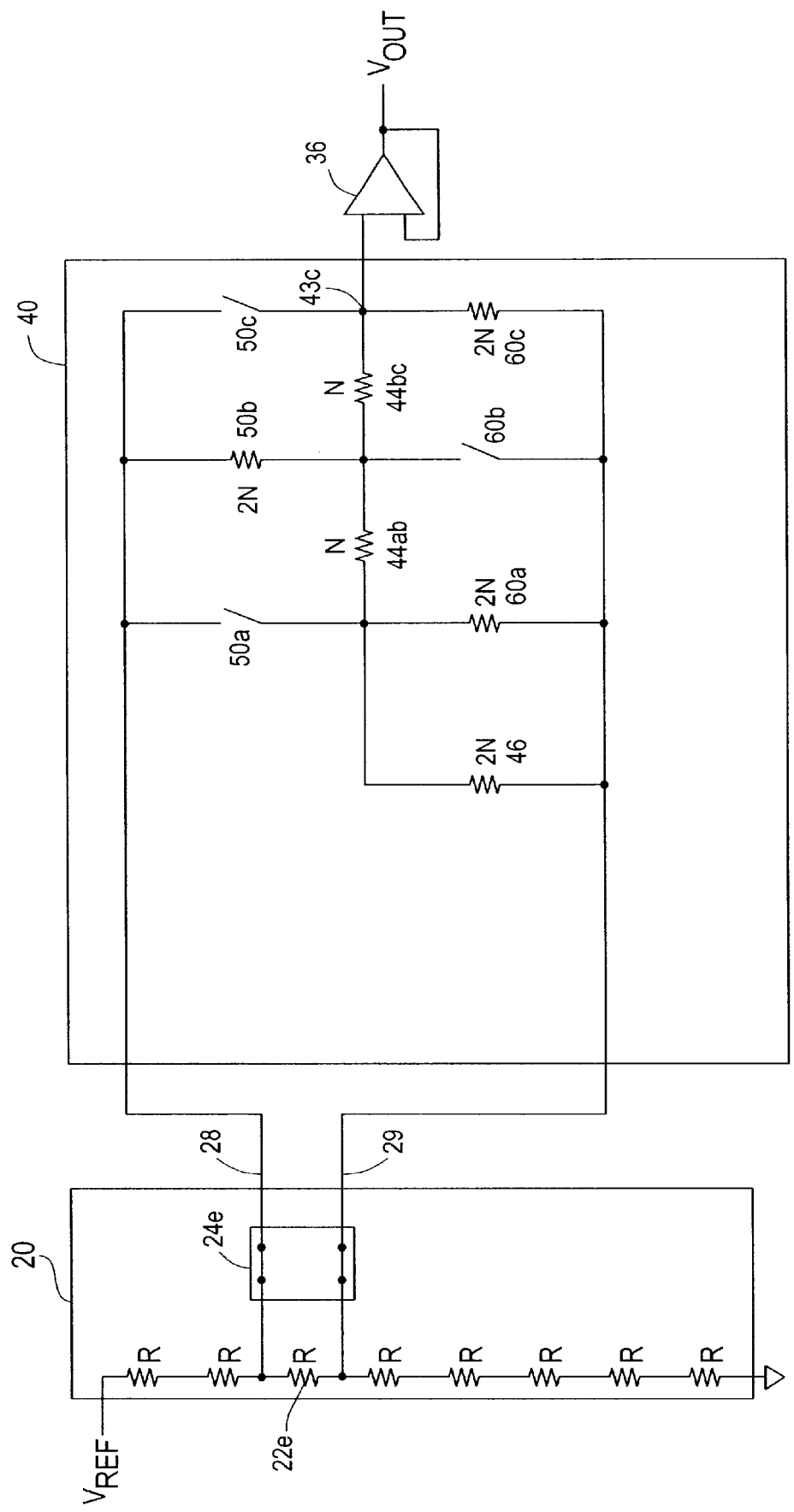
FIG. 4 is an illustration of the operation of the segmented DAC of FIG. 3.

The operation of the DAC is illustrated in FIG. 4, where the digital word to be converted is 100010 (MSB . . . LSB) and the reference voltage, $V_{ref}$, is 2.50 volts. The upper/lower switch pair 24e of the first stage 20 that is associated with the MSB segment value "100" is active and the upper-level and lower-level voltage references produced at the two output nodes 28, 29 are 1.56 volts and 1.25 volts, respectively.

In the second divider stage 40, an LSB segment value of "010" enables the lower NMOS device 60a of the B1 pair, the upper NMOS device 50b of the B2 pair, and the lower NMOS device 60c of the B3 pair. Therefore, these devices are replaced in the circuit diagram with their effective resistances, 2N ohms. The B1 upper NMOS device 50a, the B2 lower NMOS device 60b, and the B3 upper NMOS device 50c are all disabled, so these devices are shown as open circuits. The interconnecting devices are the permanently enabled NMOS devices 44 represented by their effective resistances, N ohms. The resulting binary-weighted currents produce a voltage of 1.33 volts at the output node 43c that corresponds to the digital word 100010 for a voltage reference, $V_{ref}$, of 2.50 volts.

The present invention takes advantage of the resistive behavior of the NMOS device which presents a resistance N ohms, that is inversely proportional to its width-to-length (W/L) ratio when enabled. The sheet resistance of an NMOS device is typically 4K ohms per square (L/W=1 square unit), and very long (high L) devices of narrow width (low W) provide an accurate, high-value resistance. However, very narrow devices should be avoided because small random photolithographic errors make device matching very difficult. Because the N-2N structure is not inherently monotonic, the devices must be sized appropriately to achieve the device matching necessary to ensure monotonic performance. Larger area NMOS devices are also preferred because they allow for easier device matching and lower flicker noise. Furthermore, the input impedance of the array should be approximately ten times the output impedance of the first divider stage to prevent input impedance variations from causing non-monotonicity. For example, a device may have a 5/80 width-to-length ratio and an equivalent resistance of approximately 65K ohms.

To operate an NMOS device in a resistive mode, the drain voltage, $V_D$, must be kept at a level much lower than the gate voltage, $V_G$, that is, $V_G \gg V_D$. Preferably, $V_G$ is set at approximately 7.0 volts, while $V_D$ is kept between 0.0 and 1.0 volts. (Note that when the opposite occurs, i.e. $V_D \gg V_G$, the drain current becomes constant and the output impedance increases as the device becomes non-linear.) Therefore, the voltage across the N-2N array (i.e., $V_{refu}-V_{refl}$) should be kept small, preferably less than 1.5 volts, to minimize the drain-to-source voltage ($V_{DS}$) and bulk-to-source voltage ($V_{BS}$) and thereby avoid non-linear effects. In addition, the switching, or threshold, voltage, $V_t$, which is typically 0.7 volts, can vary from device to device and this mismatch may be caused by, inter alia, a variation in oxide thickness, oxide charge, photolithographic effects, and the stress profile of the silicon. A "one-sigma" statistical mismatch of 2 mV is typically for NMOS devices. Ultimately, the mismatch negatively impacts the other performance parameters of the DAC. To minimize the effects of the mismatch, the "on" voltage level of the switching signals, B1, B1/, B2, B2/, B3, B3/, should be much higher than the drain voltage, $V_D$. Furthermore, to ensure a uniform impedance per unit area when the NMOS devices are enabled, the gates of the devices should be switched between a fixed common voltage and ground. Those NMOS devices that are not switched should have their gates permanently tied to the same fixed common voltage.

Because an NMOS device offers a relatively high equivalent resistance per unit area, while also providing the switching function inherent in such devices, a compact layout less than one-half the size of conventional R-2R arrays may be achieved. The preferred approach is to use two parallel NMOS devices having a total effective resistance proportional to L/2W ohms for the "N" element and a single NMOS device having an effective resistance proportional to L/W ohms for the "2N" element. This provides for better device matching. However, the alternative approach may be used if a higher input impedance is desired wherein a single NMOS device with an effective resistance proportional to L/W ohms for the "N" element and two series NMOS devices having a total effective resistance proportional to 2L/W ohms for the "2N" element.

The DAC may be further enhanced by the addition of one or more NMOS devices of higher resistance across each of the NMOS devices of the complementary upper/lower device pairs 42. These devices are enabled or disabled to precisely adjust, or "trim," the device resistance to match the specified binary bit weight. This trimming may be hard-wired or set on a power-up calibration. A trimmed DAC is monotonic out to several more bits, while the added trimmer devices do not contribute significantly to the consumption of valuable die space due to their small resistance values.

Those skilled in the art will recognize that the "N-2N" array of FIG. 3 has a balanced, or "differential", structure in that the array is connected across the upper and lower voltage references and is not referenced to ground. However, alternative balanced or unbalanced array structures may be employed that achieve some or all of the advantages of the present invention.

Those skilled in the art will also recognize that where the digital word to be converted contains more or less than six bits, either, or both, the first and last divider stages may be adapted to handle more or less than three bits. When the above-discussed limitations prevent an increase in the size of the divider stages sufficient to accommodate the desired number of bits, the DAC may be readily adapted to have more than the illustrated two stages by adding one or more intermediate stages between the first stage 20 and the second stage 40. The added intermediate stages may be a constant impedance resister string having resistors of matched resistance values or, alternatively, may be a binary-weighted array. Preferably, any such intermediate stage is a constant impedance resister string, since both an upper-level voltage reference output and a lower-level voltage reference output must be generated by each intermediate stage for the following stage and this requirement may add complexity to the above-described "2N-N" array which is configured to generate only a single voltage output.

The disclosed digital-to-analog converter may be used in a wide variety of applications. Furthermore, it should be appreciated by those skilled in the art that the digital-to-analog converter may alternatively employ p-type MOS (PMOS) devices to compose a "P-2P" array. In a converter employing PMOS devices, the voltage polarities are generally the reverse of those shown. For example, whereas the gate voltage for a logic "one" level is positive with respect to the source for an NMOS device, the gate voltage for a logic "one" level is negative with respect to the source for a PMOS device. The resistance of a PMOS device is typically twice the resistance of an NMOS device having the same area. This may make the use of a PMOS device preferable in circuits where minimal loading of the prior stage is desired.

Having described a preferred embodiment of the invention, it will be apparent to one of skill in the art that other embodiments incorporating its concepts may be used. Accordingly, the invention should be limited only by the spirit and scope of the appended claims.

We claim:

1. A digital-to-analog converter for converting a digital input signal into an analog output signal, said digital input signal consisting of a plurality of binary bits including a lowest binary bit and a highest binary bit, said converter including a binary-weighted transistor array for converting at least two of the binary bits of the digital input signal, said binary-weighted array comprising:

for each of the at least two binary bits, a metal oxide semiconductor device pair consisting of an upper metal oxide semiconductor device and a lower metal oxide semiconductor device series-connected at a common node and between a upper-limit voltage reference and a lower-limit voltage reference, said upper metal oxide semiconductor device activated by a switch control signal generated in response to the binary bit, said lower metal oxide semiconductor device activated by an inverse of the switch control signal, said upper and lower metal oxide semiconductor switches each having an effective resistance inversely proportional to a W/L line ratio; and for adjacent ones of the at least two binary bits, an interconnecting metal oxide semiconductor device connected between the common nodes of the metal oxide semiconductor device pairs of the adjacent binary bits, said interconnecting metal oxide semiconductor device permanently activated by a fixed voltage control signal and having an effective resistance inversely proportional to a 2W/L line ratio.

2. The digital-to-analog converter of claim 1 wherein said metal oxide semiconductor is an n-type.

3. The digital-to-analog converter of claim 1 wherein said metal oxide semiconductor is a p-type.

4. The digital-to-analog converter of claim 1 wherein the switch control signal for each metal oxide semiconductor device pair is switched between a common high-level voltage and ground, and further wherein the fixed voltage control signal is set to the common high-level voltage.

5. The digital-to-analog converter of claim 1 wherein each interconnecting metal oxide semiconductor device comprises two parallel-connected metal oxide semiconductor device units.

6. The digital-to-analog converter of claim 1 wherein each upper metal oxide semiconductor device, lower metal oxide semiconductor device and one-half bit shift metal oxide semiconductor device comprises two series-connected metal oxide semiconductor device units.

7. A digital-to-analog converter for converting a digital input signal into an analog output signal, said digital input signal consisting of a plurality of binary bits segregated into a most significant bit segment and a least significant bit segment, said least significant bit segment including a lowest least significant binary bit and a highest least significant binary bit, said converter comprising:
   a. a first divider stage comprising:
      a constant impedance resistor string for generating a series of voltages from a voltage reference; and
      a first plurality of switches connected to the resistor string and a second plurality of switches connected to the voltage string, said first plurality of switches selecting an upper-limit voltage reference in response to the most significant bit segment, and said second plurality of switches selecting a lower-limit voltage reference in response to the most significant bit segment; and
   b. a second divider stage comprising:
      for each binary bit of the least significant bit segment, a metal oxide semiconductor device pair consisting of an upper metal oxide semiconductor device and a lower metal oxide semiconductor device series-connected at a common node and between the upper-limit voltage reference and the lower-limit voltage reference, said upper metal oxide semiconductor device activated by a switch control signal generated in response to the binary bit, said lower metal oxide semiconductor device activated by an inverse of the switch control signal, said upper and lower metal oxide semiconductor switches each having an effective resistance inversely proportional to a W/L line ratio, said analog output signal generated at the common node of the metal oxide semiconductor switch pair of the highest least significant binary bit;
      for adjacent binary bits of the least significant bit segment, an interconnecting metal oxide semiconductor device connected between the common nodes of the metal oxide semiconductor device pairs of the adjacent binary bits, said interconnecting metal oxide semiconductor device permanently activated by a fixed voltage control signal and having an effective resistance inversely proportional to a 2W/L line ratio; and
      for the lowest least significant binary bit, a one-half bit shift metal oxide semiconductor device connected between the common node of the metal oxide semiconductor device pair of the lowest binary bit and the lower-limit voltage reference, said one-half bit shift metal oxide semiconductor device permanently activated by the fixed voltage control signal and having an effective resistance inversely proportional to the W/L line ratio.

8. The digital-to-analog converter of claim 7 wherein said metal oxide semiconductor is an n-type.

9. The digital-to-analog converter of claim 7 wherein said metal oxide semiconductor is a p-type.

10. The digital-to-analog converter of claim 7 wherein the switch control signal for each metal oxide semiconductor device pair is switched between a common high-level voltage and ground, and further wherein the fixed voltage control signal is set to the common high-level voltage.

11. The digital-to-analog converter of claim 7 wherein each interconnecting metal oxide semiconductor device comprises two parallel-connected metal oxide semiconductor device units.

12. The digital-to-analog converter of claim 7 wherein each upper metal oxide semiconductor device, lower metal oxide semiconductor device and one-half bit shift metal oxide semiconductor device comprises two series-connected metal oxide semiconductor device units.

\* \* \* \* \*